(12) United States Patent
Mondot et al.

(10) Patent No.: US 8,481,378 B2
(45) Date of Patent: *Jul. 9, 2013

(54) EFFECTING SELECTIVITY OF SILICON OR SILICON-GERMANIUM DEPOSITION ON A SILICON OR SILICON-GERMANIUM SUBSTRATE BY DOPING

(75) Inventors: Alexandre Mondot, Grenoble (FR); Markus Gerhard Andreas Muller, Grenoble (FR); Thomas Kormann, Grenoble (FR)

(73) Assignees: STMicroelectronics (Crolles 2) SAS, Crolles Cedex (FR); NXP B.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 13/279,466

(22) Filed: Oct. 24, 2011

(65) Prior Publication Data

US 2012/0282747 A1 Nov. 8, 2012

Related U.S. Application Data

(63) Continuation of application No. 12/375,895, filed as application No. PCT/EP2007/057898 on Jul. 31, 2007, now Pat. No. 8,080,452.

(30) Foreign Application Priority Data

Aug. 1, 2006 (EP) ..................................... 06300843

(51) Int. Cl.
| | |
|---|---|
| *H01L 21/331* | (2006.01) |
| *H01L 21/00* | (2006.01) |
| *H01L 21/20* | (2006.01) |
| *H01L 21/4763* | (2006.01) |

(52) U.S. Cl.
USPC ........... 438/181; 438/256; 438/376; 438/514; 438/630; 438/752; 257/E21.315; 257/E21.334; 257/E21.347; 257/E21.461; 257/E21.593

(58) Field of Classification Search
USPC ................... 257/E21.315, E21.334, E21.347, 257/E21.461, E21.593
See application file for complete search history.

(56) References Cited

U.S. PATENT DOCUMENTS

| | | | | |
|---|---|---|---|---|
| 4,879,255 | A | * | 11/1989 | Deguchi et al. ............... 438/207 |
| 5,960,270 | A | * | 9/1999 | Misra et al. ................... 438/197 |

(Continued)

OTHER PUBLICATIONS

O'Neil, PA, et al; "Growth of Selective Silicon Epitaxy Using Disilane and Chlorine on Heavily Implanted Substrates"; Journal of the Electrochemical Society, vol. 146, No. 8,1999; pp. 3070-3078; XP009092920.

(Continued)

*Primary Examiner* — Mohsen Ahmadi
(74) *Attorney, Agent, or Firm* — Gardere Wynne Sewell LLP

(57) ABSTRACT

A method for selective deposition of Si or SiGe on a Si or SiGe surface exploits differences in physico-chemical surface behavior according to a difference in doping of first and second surface regions. By providing at least one first surface region with a Boron doping of a suitable concentration range and exposing the substrate surface to a cleaning and passivating ambient atmosphere in a prebake at a temperature lower or equal to 800° C., a subsequent deposition step will prevent deposition in the first surface region. This allows selective deposition in the second surface region, which is not doped with the Boron (or doped with another dopant or not doped). Several devices are, thus, provided. The method saves a usual photolithography sequence, which according to prior art is required for selective deposition of Si or SiGe in the second surface region.

34 Claims, 3 Drawing Sheets

U.S. PATENT DOCUMENTS

| | | | |
|---|---|---|---|
| 6,696,328 | B2 | 2/2004 | Rhee et al. |
| 6,797,555 | B1* | 9/2004 | Hopper et al. ............... 438/217 |
| 2003/0137008 | A1* | 7/2003 | Nozaki et al. ............... 257/347 |
| 2005/0136584 | A1 | 6/2005 | Boyanov et al. |
| 2006/0131622 | A1* | 6/2006 | Yamada et al. ............... 257/288 |
| 2006/0189106 | A1* | 8/2006 | Takami et al. ............... 438/514 |
| 2007/0026584 | A1 | 2/2007 | Marshall |
| 2007/0155144 | A1* | 7/2007 | Matsuzaki et al. ............ 438/514 |
| 2008/0202582 | A1 | 8/2008 | Noda |
| 2008/0203449 | A1 | 8/2008 | Zhang et al. |
| 2009/0087967 | A1 | 4/2009 | Todd |

OTHER PUBLICATIONS

Alieu, J., et al; Performance, New Short and Narrow Channel Effects and Manufactucability With SI Epitaxial Channel for Low Voltage and Low Power 0.12/0.18 M Conference; 1999; pp. 400-403; XP009092907.

Liu, J., et al; "Nickel Germanosilicide Contacts Formed on Heavily Boron Doped Si1-GexSource/Drain Juncation for Nanoscale CMOS"; IEEE Transactions on Electron Devices; IEEE Service Center, Pisacataway, NJ, US; vol. 52, No. 7; Jul. 2005; pp. 1535-1540; XP011135516; ISSN: 0018-9383.

Song, S., et al; "Design of Sub-100NM CMOSFETS: Gate Dielectrics and Channel Engineering"; 2000 Symposium on VLSI Technology, Digest of Technical Papers; Honolulu, Jun. 13-15, 2000; Symposium on VLSI Technology, New York, NY: IEEE, US; Jun. 13, 2000; pp. 190-191; XP000970813; ISBN: 0-7803-6306-x.

Noda, K., et al; "0.1 Um Delta-Doped MOSFET Using Post Low-Energy Implanting Selective Epitaxy"; Symposium on VLSI Technology, Digest of Technical Papers; Honolulu, Jun. 7-9, 1994; New Your, IEEE, US; vol. SYMP 14; Jun. 7, 1994; pp. 19-20; XP000498563; ISBN 0-7803-1922-2.

International Search Report and Written Opinion for PCT/EP2007/057898 mailed Dec. 11, 2007 (3 pages).

* cited by examiner

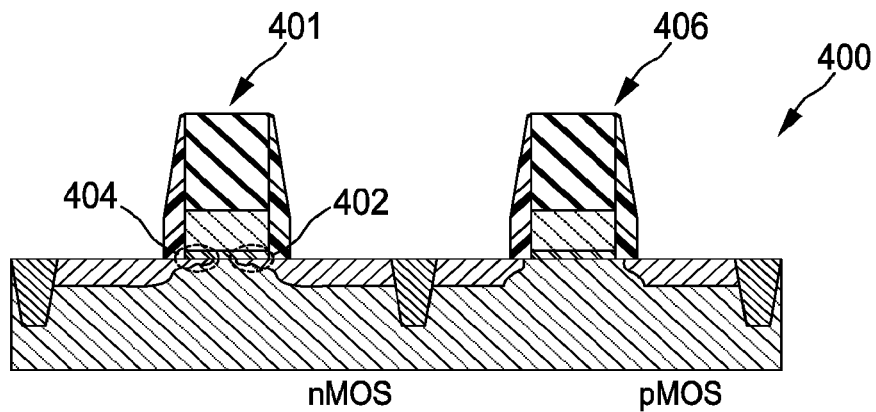
FIG.11 -PRIOR ART-
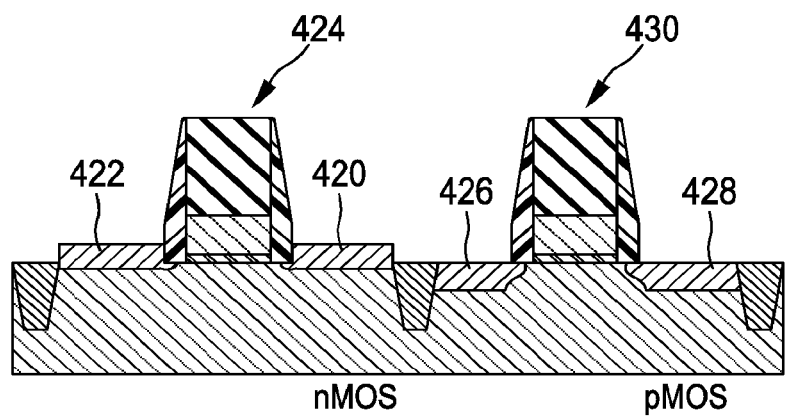
FIG.12

EFFECTING SELECTIVITY OF SILICON OR SILICON-GERMANIUM DEPOSITION ON A SILICON OR SILICON-GERMANIUM SUBSTRATE BY DOPING

CROSS-REFERENCE TO RELATED APPLICATION

This application claims the benefit of U.S. patent application Ser. No. 12/375,895 given a U.S. filing date of Jan. 30, 2010, the disclosure of which is hereby incorporated by reference in its entirety and to the maximum extent allowable by law. This application also claims the benefit of International Application No. PCT/EP2007/057898 filed Jul. 31, 2007, which claims the benefit of European Patent Application No. 06300843.7 filed Aug. 1, 2006; the disclosure of each is hereby incorporated by reference in their entirety and to the maximum extent allowable by law.

BACKGROUND

The present invention relates to a method for selective deposition of Silicon (Si) or Silicon Germanium (SiGe) on a Si or SiGe surface. The invention further relates to a method for differential metal silicide formation, and to a method for forming a CMOS semiconductor device with an NMOS field effect transistor, which has elevated source and drain regions, and with a PMOS field effect transistor, which has non-elevated source and drain regions.

Semiconductor processing flows employ photolithography steps for patterning the Silicon wafer. For instance, in CMOS (complementary metal oxide semiconductor) technology, PMOS- and NMOS-specific processing steps like, e.g., specific implantations or epitaxial and non-epitaxial Si or SiGe deposition are performed using photolithography in order to provide the required selectivity of processing.

A typical example of a selective growth method for Silicon that makes use of photolithography processing is presented in U.S. Pat. No. 6,696,328 B2. In order to selectively grow a second polysilicon layer on an exposed first polysilicon layer only in an NMOS region, but not in a PMOS region, the top of the PMOS region is covered by a hard mask layer. This way, the second polysilicon layer is only deposited in the NMOS region. The hard mask is also used to protect the PMOS region during subsequent ion implantation into the NMOS region for N-type doping.

Photolithography involves a combination of substrate preparation, photoresist application, soft-baking, exposure, developing, hard-baking, etching, and various other chemical treatments (thinning agents, edge-bead removal etc.) in repeated steps. Therefore, due to the complex processing sequence with high resolution and extreme accuracy requirements, photolithography represent a very high cost factor in semiconductor processing.

It is preferred to provide a method for selective deposition of Si or SiGe on a Si or SiGe surface that reduces the processing cost by reducing the use of photolithography.

SUMMARY

Therefore, the invention provides methods for selective deposition of Si or SiGe on a Si or SiGe surface. In one or more forms, a method comprises the following:

providing a substrate with a Si or SiGe surface that has at least one first surface region, which is doped with Boron at a concentration of at least $1\times10^{19}$ cm$^{-3}$ and in which subsequent growth of Si or SiGe is to be either inhibited or completely suppressed, and with at least one second surface region, which is not doped with Boron at a concentration of at least $1\times10^{19}$ cm$^{-3}$ and in which subsequent growth of Si or SiGe is to be performed;

a prebake step, in which the substrate surface is exposed to a passivating ambient atmosphere at a temperature, which is lower or equal than 800° C.; and a subsequent deposition step, in which the substrate surface is exposed to deposition conditions that are suitable for deposition of a Si or SiGe layer, thus inhibiting or completely suppressing growth of Si or SiGe in the at least one first surface region and depositing Si or SiGe in the at least one second surface region.

The methods of the present invention exploit differences in physico-chemical surface behaviour according to the difference in doping of the first and second surface regions. By providing the at least one first surface region with a Boron doping at a concentration of at least $1\times10^{19}$ cm$^{-3}$ and exposing the substrate surface to a passivating ambient atmosphere at a temperature lower or equal than 800° C., a subsequent deposition step of Si or SiGe will not lead to a layer deposition in the at least one first surface region. This surprising effect is used according to the present invention for selective deposition of Si or SiGe in the at least one second surface region, which is not doped with Boron. The method as described thus saves a usual photolithography sequence required for selective deposition of Si or SiGe in the mentioned prior art.

The methods of the present invention are based on the recognition that exposing a substrate surface, which is patterned by doping the at least one surface region with Boron at a concentration of at least $1\times10^{19}$ cm$^{-3}$, to the subsequent prebake in a passivating ambient atmosphere at a temperature, which is lower than or equal to 800° C., is primordial for achieving selectivity in Si or SiGe deposition.

The at least one second surface region, in which subsequent growth of Si or SiGe is to be performed, is not doped with Boron at a concentration of at least $1\times10^{19}$ cm$^{-3}$. That means, it may be doped with Boron, but at ca concentration lower than $1\times10^{19}$ cm$^{-3}$, or it may be doped with a dopant other than Boron, such as an N-type dopant, or another P-type dopant, or it may be undoped.

The term selectivity is thus to be understood as a spatial selectivity, which achieves Si or SiGe deposition only in selected second lateral surface regions on a Si or SiGe surface as a consequence of the described pre-processing.

It is noted that the term selectivity is used in the present context with a meaning that extends the meaning of the term as generally used in the art. In the art, selective epitaxy has been used to express selectivity towards dielectric materials, examples being Silicon dioxide or Silicon nitride. In that sense, selective epitaxy as known in the art leads to a monocrystalline deposit of Si or SiGe on a substrate with a crystalline Si or SiGe surface, and to a poly-crystalline deposit, namely of poly-Si or poly-SiGe, on a poly-crystalline substrate with poly-Si or poly-SiGe surface, and to no deposition on the dielectric material. A non-selective epitaxy in that sense leads to a mono-crystalline deposit of Si or SiGe on a substrate with a crystalline Si or SiGe surface, a poly-crystalline deposit, namely of poly-Si or poly-SiGe, on a substrate with a poly-crystalline poly-Si or poly-SiGe surface, and, as a consequence of non-selectivity, to a poly-crystalline deposit, namely of poly-Si or poly-SiGe, on the dielectric material. Selective epitaxy in this "classic" sense can be achieved with the use of a chlorinated chemistry during the deposit. Selective epitaxy in this "classic" sense is not excluded by the present invention, but, in fact, employed in preferred embodiments.

However, the present invention adds an additional meaning to the terms "selectivity" and "non-selectivity". Namely, with the method of the present invention, selectivity can be achieved towards a B-doped Si or SiGe substrate surface. In that additional sense, selective epitaxy leads to a mono-crystalline deposit of Si or SiGe on a substrate with a crystalline Si or SiGe surface, which is not doped with Boron and has been exposed to the prebake step, a poly-crystalline deposit, namely of poly-Si or poly-SiGe, on a substrate with a poly-crystalline Si or SiGe surface, which is not doped with Boron and has been exposed to the prebake step, and to no deposition on on a substrate with a crystalline or polycrystalline Si or SiGe surface, which is doped with Boron and which has been exposed to the prebake step.

A non-selective epitaxy in the additional sense can be achieved after performing the prebake step at a temperature higher than 800° C.

A passivating ambient atmosphere is an ambient atmosphere that is suitable for deoxidizing the exposed substrate surface, given a suitable temperature of the passivating ambient atmosphere, and for inhibiting spontaneous formation of native Silicon dioxide on the surface for at least some time. An example of a passivating ambient atmosphere is a $H_2$ atmosphere.

The inventors have observed that using temperature values of more than 800° C. during the prebake step will lead to a deposition of Si or SiGe during the subsequent deposition step. Thus, the present invention provides a processing window for selective Si or SiGe regrowth.

Deposition conditions that are suitable for epitaxial or non-epitaxial deposition of a Si or SiGe layer on a Si or SiGe surface are well known in the art and should be used for the selective deposition step. The Boron doping of the first surface region and the subsequent prebake step provide for the selectivity according to the method of the present invention, inhibiting or completely suppressing a deposition of Si or SiGe in the first surface region and allowing deposition of Si or SiGe in the second surface region.

Note that the term deposition is used to comprise both epitaxial and non-epitaxial layer growth. In general, it will be clear from the specific application for a person of ordinary skill in the art whether an epitaxial or non-epitaxial deposition is performed. However, the deposition type will be specified where specifying the technical processing in this detail is helpful in understanding the invention.

It is noted that the use of the term surface region in the description of the present invention does not exclude that doping in a lateral region defined by this term extends deeper into the substrate. It rather means that a particular doping is present at least at the surface and may continue in the substrate with increasing distance from the surface.

In the following, embodiments of the method of the invention will be described. It is noted that embodiments can be combined with each other, unless this is excluded explicitly in the pertaining description. One or more preferred embodiments of the invention are also defined in the dependent claims.

Preferably, a SiGe surface should contain a Germanium fraction not higher than 40% for performing the method of the invention.

According to one preferred embodiment, the step of providing the substrate comprises
implanting Boron into the first surface region;
performing an ex-situ cleaning step, in which silicon dioxide is removed from the substrate surface. In this embodiment, the prebake step is preferably performed in situ.

Therefore, two different cleaning steps are used in this embodiment for removing Silicon dioxide, which usually is referred to as "native oxide" due to its spontaneous formation in natural environments, which contain oxygen (air, water, etc.). A first cleaning step is performed ex-situ, i.e., outside a reactor, in which the subsequent deposition step is performed. The second cleaning step, that is, the prebake step, is performed in-situ. By performing two subsequent cleaning steps, the removal of native oxide is improved. Furthermore, performing the prebake step in-situ helps to avoid any further exposure of the substrate surface to an oxidizing ambient atmosphere before the deposition step.

In a further preferred embodiment, the step of providing the substrate comprises providing a Boron concentration between $5\times10^{19}$ cm$^{-3}$ and $1\times10^{22}$ cm$^{-3}$ in the first surface region. This concentration window has proved to be particularly useful in achieving the desired selectivity. A concentration of Boron above $1\times10^{20}$ cm$^{-3}$ is preferred for blocking layer deposition with particular efficiency.

In a further preferred embodiment, the step of providing the substrate surface comprises doping the at least one second substrate region with an N-type dopant. Examples of N-type dopants are Arsenic (As) and Phosphorus (P). As will be further described in more specific embodiments later in the present specification, this embodiment is particularly useful in achieving selective growth of Si or SiGe in CMOS devices.

In a further embodiment, a plurality of second surface regions is contained in the provided substrate surface, with some of the second surface regions being undoped and others being N-doped.

In another embodiment, the step of providing the surface comprises fabricating a doped polysilicon line on the substrate surface. The doped polysilicon line comprises the at least one first surface region. In this embodiment, the surface is structured also in a vertical direction. The polysilicon line is preferably structured after Boron implantation. By suitable doping of the polysilicon line with Boron and a prebake in a passivating ambient atmosphere, as described, the surface of the polysilicon line will form a first surface region in the sense of the present invention, i.e., a surface region, in which the deposition step will not lead to deposition of Si or SiGe. It is understood that in a variant of this embodiment another first surface region can be provided in lateral surface areas outside the polysilicon line.

One preferred application of the method of the invention is in a method for differential metal silicide formation. Herein, a metal-rich phase of a metal silicide is to be formed in the at least one first surface region, and a metal-poor phase of a metal silicide is to be formed in the at least one second surface region. The metal-poor phase of the metal silicide has a lower relative metal content than the metal-rich phase, thus increasing the fraction of Si or SiGe and justifying the term "metal-poor". The method for differential metal silicide formation comprises performing the method of the present invention or one of the previously described embodiments, and thus forms an embodiment of the present invention.

This method furthermore comprises, in the step of providing the substrate, providing a substrate with a Si or SiGe surface layer. The deposition step comprises selectively depositing a Si or SiGe overlayer in the second surface region.

The present embodiment further comprises depositing a metal in the first and second surface regions. Furthermore, an annealing step is performed at an annealing temperature for an annealing time span, the annealing temperature and the annealing time span being suitable for forming the metal-rich metal silicide phase in the first surface region of the Si or SiGe surface layer and for forming the metal-poor metal silicide phase in the Si or SiGe overlayer and in the Si or SiGe surface layer in the second surface region.

The annealing step comprises in one embodiment, two subsequent annealing steps:
- a first annealing step at a first annealing temperature for a first annealing time span, which first annealing temperature and first annealing time span are suitable for forming the metal-rich metal silicide phase in the first surface region of the Si or SiGe surface layer and in the second surface region of the Si or SiGe overlayer, leaving at least some of the Si or SiGe surface layer in the second surface region underneath the metal-rich metal silicide phase unmetallized;
- at least a second annealing step at a second annealing temperature and for a second annealing time span, which second annealing temperature and second annealing time span are suitable for forming the metal-poor metal silicide in the Si or SiGe overlayer and in the Si or SiGe surface layer in the second surface region.

With the present embodiment, a complete silication of initial Si or SiGe gates is performed, which is a very pragmatic approach for obtaining a metallic gate in a CMOS technology. Furthermore, electrodes with different metal silicide phases are obtained, for instance for NMOS and PMOS devices in a CMOS component. Different metal silicide phases can be used to form electrodes for NMOS and PMOS devices with N- and P-type like work functions, respectively.

The integration of two different silicides required a higher integration effort in the prior art. Most proposals known deal with an approach that uses chemical mechanical polishing (CMP) and subsequent silicidation steps for the N- and P-type gate lines, which requires at least one masking step. Alternatively, a common silicidation of both gates was proposed after a partial back-etching of the gate type that receives the metal-rich silicide. Also this latter approach requires at least one photolithography step to mask the complementary gate line type.

The present embodiment of the method of the invention considerably simplifies the integration scheme. It achieves a concurrent formation of both, the metal-rich and the metal-poor metal silicide phases in the first and second surface regions. This is called "differential metal silicide formation" herein.

Accordingly, a further aspect of the present invention is formed by a semiconductor device. The semiconductor device comprises
- a first electrode with a first metal silicide layer of a metal-rich silicide phase in at least one first surface region of a Si or SiGe surface layer, which is not doped with Boron at a concentration of at least $1 \times 10^{19}$ cm$^{-3}$, and further comprises
- a second electrode with a second metal silicide layer of a metal-poor silicide phase in at least one second surface region of the Si or SiGe surface layer, which is doped with Boron at a concentration of at least $1 \times 10^{19}$ cm$^{-3}$. In the semiconductor device of the invention the first metal silicide layer has a larger height than the second metal silicide layer.

This basically means that by providing semiconductor electrodes with different heights, a different metal content per unit volume of semiconductor material can be achieved after reaction of the semiconductor material in the electrode and a metal layer deposited on the gates. In this way, the work function of the electrode can be tweaked.

In a preferred embodiment of this semiconductor device, the first and second electrodes are gate electrodes, the first surface region forms a P-type well, and the second surface region forms an N-type well in a substrate.

Returning to the description of embodiments of the method for differential metal silicide formation, in a preferred form of this embodiment the step of providing the substrate comprises a step of depositing an electrically insulating layer before depositing the Silicon surface layer. This embodiment of the method for differential metal silicide formation is particularly useful for forming gate electrodes in PMOS and NMOS regions of a CMOS component. The electrically insulating layer may be made of a high-K oxide material, such as, by way of example, $HfO_2$, $ZrO_2$, $Hf_{1-x}Si_xON$, $Hf_{1-x}ZrO_2$, $Al_2O_3$, or the like.

For providing the substrate in this embodiment, a masked implantation of Boron into the Si surface layer in the first surface region is preferably performed. In the masked implantation step, only the first surface region of the surface layer is exposed to the boron doping.

For gate electrode formation in the first and second surface regions, a step of laterally structuring the Silicon surface layer and the Silicon overlayer is preferably performed before the step of depositing the metal.

One preferred embodiment that can be used for formation of source and drain regions comprises the steps of
- selectively removing the Si surface layer in a third surface region of the substrate,
- depositing Si or SiGe in the third surface region and
- doping the deposited Si or SiGe in the third surface region with a P-dopant.

Another preferred embodiment of the method of the invention concerns the growth of NMOS and PMOS field effect transistors in a CMOS semiconductor device. The embodiment solves a problem known as "encroachment", which is a persistent problem in the source/drain regions after a silicidation with certain metals such as Nickel (Ni). The term "encroachment" describes NiSi diffusion phenomena into the substrate and under lateral spacers at the gate electrode towards the channel region. This problem occurs mostly in N$^+$ active areas. It leads to an increase in the junction leakage since NiSi spikes diffuse into regions behind the heavily doped source/drain regions.

The problem can be solved by a method for forming a CMOS semiconductor device with an NMOS field effect transistor, which has elevated source and drain regions, and with a PMOS field effect transistor, which has non-elevated source and drain regions. In the present embodiment, the method of the invention or one of its mentioned embodiments is performed with the constraint that non-elevated source and drain regions of the PMOS FET are to be formed in the first surface regions and elevated source and drain regions of the NMOS FET are to be formed in the second surface regions, which are doped with an N-type dopant.

In the present embodiment, the deposition step comprises selectively depositing the elevated source and drain regions in the second surface regions.

By using elevated source and drain regions in the N$^+$ active area using a selective deposition step of Si prior to silicidation, it is possible to limit the lateral diffusion of the silicide formed afterwards under the gate as the Silicon surface is removed from the spacer edges and the implantation front of source and drain regions.

Preferably, the mentioned step of forming a metal silicide, such as a Nickel silicide, in the first and second surface region is performed after the step of selectively depositing the elevated source and drain regions in the second surface regions.

BRIEF DESCRIPTION OF THE DRAWINGS

Various embodiments will now be explained in more detail with reference to the drawings in which:

FIG. 11 shows a semiconductor device according to the prior art for a visualization of the "encroachment" effect; and FIG. 12 shows a semiconductor device obtained by an embodiment of the method of the invention and having elevated NMOS source and drain regions.

DETAILED DESCRIPTION OF THE DRAWINGS

Figure 1:
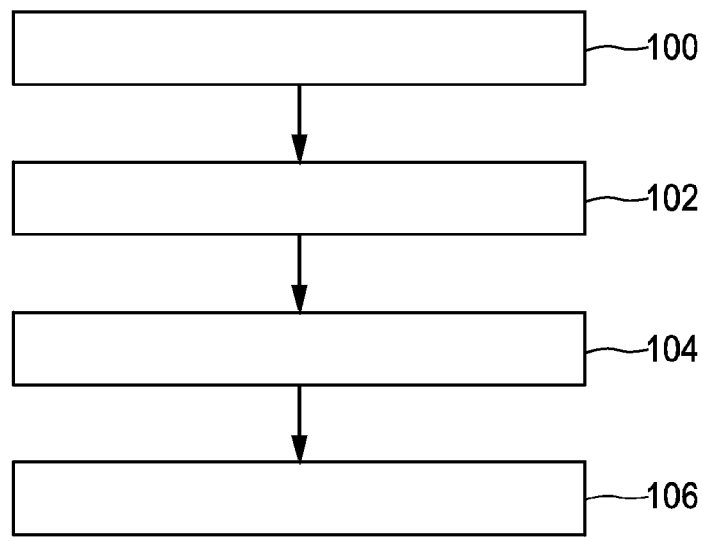
FIG. 1 shows a flow diagram of an embodiment of the method of the invention.

FIG. 1 shows a flow diagram of an embodiment of a method described. The representative embodiment makes use of a process window for an epitaxial deposition of Si or SiGe, which is provided by doping and surface preparation conditions. Within the process window, a selective deposition of Si or SiGe is achieved in dependence on the dopant species implanted in the starting Si or SiGe surface. Within this process window it is possible to set the deposition parameters in order to perform either epitaxial or non-epitaxial growth of Si or SiGe.

The process flow represented by FIG. 1 starts with a step 100, in which at least one first surface region the Si or SiGe surface is implanted with Boron by means of a masked implantation step. A typical implantation dose is $3 \times 10^{15}$ cm$^{-2}$. The acceleration voltage for this implantation dose may for instance be 2 keV. With these implantation parameters, a surface concentration of Boron of approximately $5 \times 10^{21}$ cm$^{-3}$ is achieved in the first surface region. The implantation may be performed on first surface regions formed by active areas of a semiconductor device to be fabricated or by conductive lines, such as gate lines.

In a preferred embodiment, no separate annealing step is performed after the implantation step 100.

Step 100 optionally comprises an additional masked implantation step of N$^+$ (i.e., highly N-type-doped) active areas and/or gate lines by a separate masked implantation step in second surface regions. An example of a suitable N$^+$ doping step is formed by an implantation of As with a dose of $2 \times 10^{15}$ cm$^{-2}$ at an acceleration voltage of 15 keV, giving rise to a surface concentration of As of approximately $2 \times 10^{20}$ cm$^{-3}$.

It should be noted that the doping parameters for the N$^+$ active areas are not critical for the method of the invention. Selectivity is also achieved using other implantation parameters for the N$^+$ active areas, or if N$^+$ active areas are not provided, but only undoped Si or SiGe surface regions exist beside the first surface regions, which are implanted with B.

In a subsequent cleaning step 102, the surface of the implanted substrate is exposed to a solution of hydrofluoridic acid (HF).

This HF cleaning step removes Silicon dioxide from the Silicon surface. The cleaning step 102 is useful and has led to good processing results. Thus, by performing the masked implantation step 100 and the cleaning step 102, a substrate is provided with a Si or SiGe surface that has at least one first surface region, which is doped with Boron at a concentration of at least $1 \times 10^{19}$ cm$^{-3}$. Furthermore, the provided substrate has at least one second surface region, which is not doped with Boron at a concentration of at least $1 \times 10^{19}$ cm$^{-3}$.

Subsequently, a prebake step 104 in an H$_2$ ambient atmosphere is performed. The parameters used during the H$_2$ prebake step are of high importance for determining the selectivity between the B-doped first surface regions and the second surface regions.

Specifically, the temperature of the H$_2$ prebake step is the primordial parameter for the selectivity achieved during the subsequent deposition step 106. For low H$_2$ prebake temperatures below or equal to 800° C., Si or SiGe deposition is suppressed in the B-doped first surface regions. Only minor deposition of growth nuclei is observed when using a temperature of 800° C. Below this temperature, all growth is suppressed. Therefore, the prebake step inhibits or completely suppresses growth of Si or SiGe in the first surface regions, which are doped with Boron in the subsequent deposition step 106.

In contrast, the influence of the HF cleaning step 102 on the selectivity is small. An extension of the duration of the HF cleaning step beyond standard values is possible. However, it does not show an effect with regard to selectivity in a later deposition step.

It should be noted that the employment of higher temperatures during the prebake step will lead to homogeneous deposition of a Si or SiGe layer also in the first surface regions, which are implanted with Boron. For a deposition, such as an epitaxial deposition in these first surface regions, a prebake temperature of 900° C. is preferred.

The processing conditions for non-selective and for selective growth of Si or SiGe on a Si or SiGe surface implanted with Boron or Arsenic are summarized in the following table. Note that for the following table an epitaxial deposition is assumed. The implantation doses and voltages used correspond to the examples given above and represent typical source and drain implantation recipes on advanced CMOS technology nodes.

TABLE

Process window for selective deposition of Si or SiGe on B-doped surface regions

| | As-implanted surface region | B-implanted surface region |
|---|---|---|
| Pre-bake temperature 900° C. | Homogeneous epitaxy | Homogeneous epitaxy |
| Pre-bake temperature ≦800° C. | Homogeneous epitaxy | Growth suppression (nuclei) |

Using prebake temperatures below 800° C. will lead to a complete growth suppression in the first surface region, implanted with Boron. Note that a useful lower temperature limit for the prebake step is typically 750° C. Below this temperature, it will be difficult to remove native oxide from the substrate surface and to passivate it.

Currently, the inventors tentatively assign the effect of growth suppression in B-implanted surface regions exposed to a prebake temperature of lower or equal 800° C. to a much faster reoxidation rate in the B-implanted surface regions than in As-implanted or non-implanted surface regions. This could explain a need for higher prebake temperatures in order to fully desorb a regrown oxide before an onset of layer deposition. Following this reasoning, an explanation of the observed effect is as follows: since no epitaxial growth can be achieved on silicon dioxide with a selective epitaxy in the "classic" sense, all native oxide must be carefully removed from the substrate where deposition shall be performed. However, using prebake conditions of the method, the Hydrogen passivation is not achieved on the first surface region while it is achieved on the second surface region, and Si or SiGe epitaxial or poly-crystalline growth is only possible on a Hydrogen passivated substrate.

Therefore, a process window exists, in which the As-implanted Si or SiGe surface is properly prepared for growth (hydrophobic surface without oxygen), whereas the hydrophilic B-implanted Si or SiGe surface is still covered by a superficial oxide layer, which has been reformed after the HF cleaning step 102 and which has not been desorbed by the low-temperature $H_2$ prebake step 104.

Preferably, the deposition step 106 is performed using, for instance, a reduced-pressure chemical vapor deposition (RPCVD) technique with Chloron chemistry. Other known deposition techniques may used as well. The use of Chloron chemistry, in particular, the use of HCl is necessary to assure the selectivity of the Si or SiGe deposition with respect to dielectric materials such as silicon dioxide and silicon nitride, i.e., in the "classic" sense of the term selectivity, as explained above.

Figure 2:
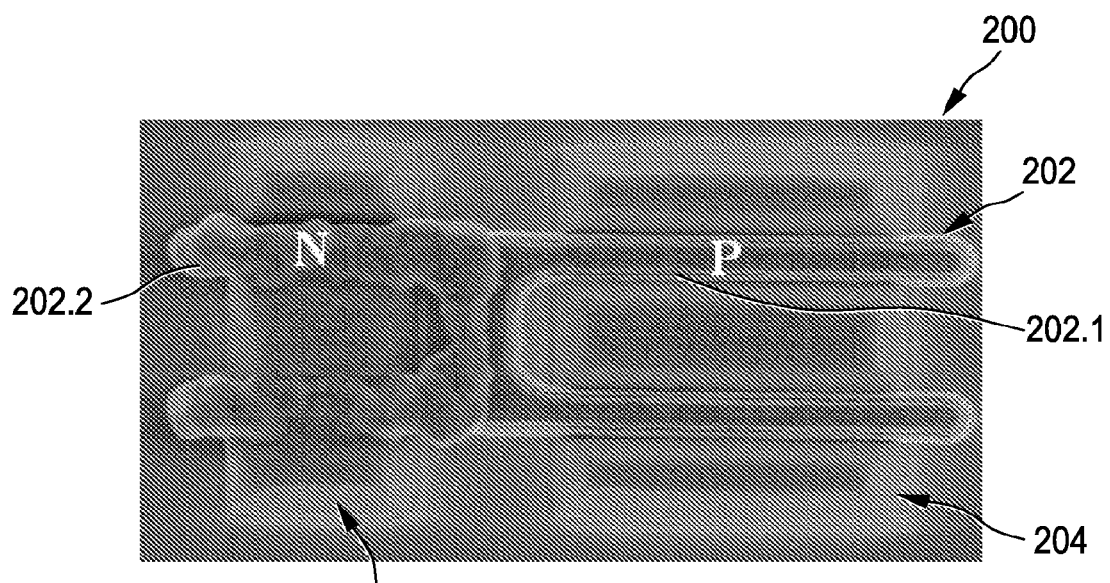
FIG. 2 shows a scanning electron micrograph of a semiconductor device after performing an embodiment of the method of the invention.
Figure 3:
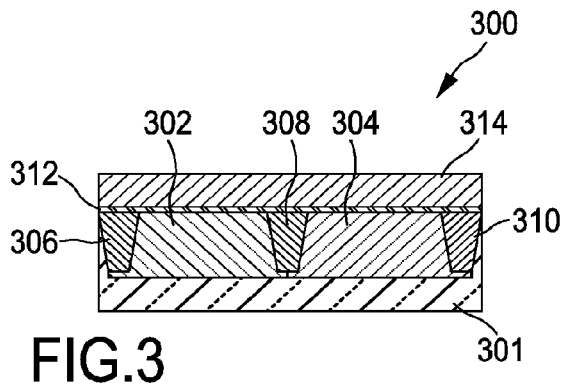
FIGS. 3 to 10 show a process flow for differential silicidation of initially poly-Si gates in a CMOS semiconductor device according to an embodiment of the invention.
Figure 4:
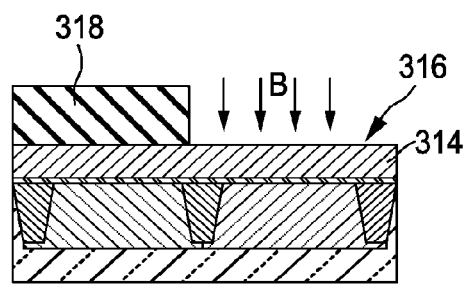
Figure 5:
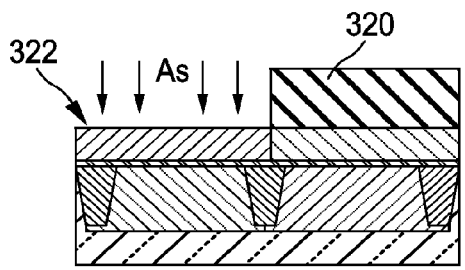

FIG. 2 shows a scanning electron micrograph of a semiconductor device after performing an embodiment of the method.

A semiconductor device 200 in the form of a logical element is shown in a top view during manufacture. A gate line structure 202, which has the shape of the capital letter "H" rotated by 90°, connects to active areas 204 and 206. The gate-line structure 202 is divided into two sections 202.1 and 202.2. The gate-line section 202.1 is implanted with Boron with an implantation dose of $3\times10^{15}$ at an acceleration voltage of 2 keV. The gate-line section 202.1 thus forms a first surface region in the wording of the previous description and of the claims. The second gate-line section 202.2 has been N-doped with Phosphorus at an implantation dose of $4\times10^{15}$, using an acceleration voltage of 14 keV. After implantation, the surface has been exposed to a HF-based cleaning agent and then exposed to a $H_2$ prebake at 800° C. for 30 seconds. Subsequently, Boron-doped SiGe epitaxy was performed in-situ without masking the gate-line structure 202.

The result of this processing, which can be seen in FIG. 2, is that the Boron-doped SiGe has only been deposited in the N-doped section 202.2, which has been implanted with Phosphorous. No traces of SiGe are observable in the gate-line section 202.1, which has been implanted with Boron. The SEM micrograph of FIG. 2 is thus a clear proof of the selectivity in growth, which is achieved by the method.

FIGS. 3 to 10 show a process flow for differential silicidation of initially poly-Si gates in a CMOS semiconductor device according to an embodiment of the method of the invention.

The method of the present embodiment achieves a so called "full gate silicidation", i.e., a complete silicidation of an initial poly-Si gate. This is a known and pragmatic approach to obtain a metallic gate in a CMOS technology. For applications on conventional "bulk" substrates (as opposed to Silicon-on-insulator (SOI) substrates), it is desirable to have N- and P-type work-function electrodes for NMOS and PMOS devices, respectively, in order to have well-adapted threshold voltages of the devices. For Hf-based high-K gate oxides, one recently described approach uses two different Nickel silicide phases, NiSi and $Ni_2Si$ for NMOS and PMOS devices, respectively. In addition, the phases $Ni_3Si$ and $Ni_{31}Si_{12}$ can, for example, be used for NMOS and PMOS devices.

However, the integration of two different silicides generally requires a higher processing effort. Most known proposals make use of a CMP technique and subsequent silicidation steps for the N- and P-type gate lines. This requires at least one masking step. Alternatively, it has been proposed to perform a common silicidation of both gates after a partial back-etching of the gate type that receives the metal-rich silicide. Also this latter approach requires at least one photolithography step to mask the complementary gate line type.

This problem represents an advantageous use case of the method of the present invention, which can considerably simplify the integration scheme. In the following, a non-restrictive example of a possible integration scheme according to an embodiment of the method of the invention will be described.

The processing starts from a substrate 300, which comprises a P-well 302 for fabrication of a NMOS FET, and an N-well 304 for fabrication of a PMOS FET overlying an insulating layer 301 (for example, with SOI). The active regions formed by the P-well 302 and the N-well 304 are separated by field oxide regions 306, 308 and 310, which are for instance formed using a shallow-trench insulation technique. A gate oxide layer 312 is in one embodiment formed by a high-K oxide material. On top of the gate oxide layer 312, a thin undoped poly-Si layer 314 is deposited. The poly-Si layer 314 forms a Si surface layer, which is implanted in two subsequent masked implantation steps shown in FIGS. 4 and 5. For implanting a first surface region 316 of the Si surface layer 314 with Boron, a mask 318 is formed by known techniques and opened only in the first surface region. The implantation with Boron serves to suppress later deposition of a Si overlayer in the first surface region 316. Implantation conditions correspond to those given above for this purpose. In a next step, after removal of the mask 318, a further mask 320 is deposited to perform a selective doping of a second surface region 322 with Arsenic. During this step, the mask 320 covers the first surface region 316.

Subsequently, the mask 320 is removed, and the substrate 300 is subjected to a HF cleaning, as described in the context of the embodiment of FIG. 1 in more detail. Then, a prebake step is performed, in which the substrate is annealed in-situ in a $H_2$ ambient atmosphere at a temperature of 800° C. (not shown).

Figure 6:
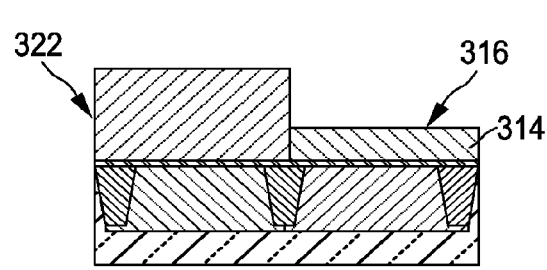
Figure 7:
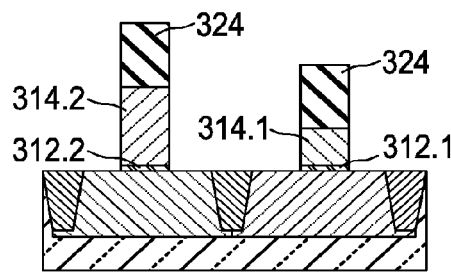
Figure 8:
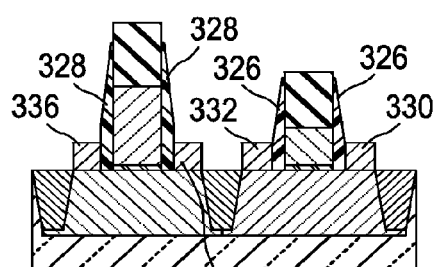

Then, poly-Silicon is selectively deposited in the second surface region 322. This step, the result of which is shown in FIG. 6, will produce elevated Silicon regions in all second surface regions, while no deposition takes place in the first surface regions 316, which had been implanted with Boron previously. This way, two different poly-Si gate heights are produced for future NMOS and PMOS devices. The thickness of the Si layer in the first surface region 316 is approximately 30 nm, and approximately 45 nm in the second surface region 322. The selective deposition step thus saves another mask step that would be required for depositing Silicon in the second surface region only according the prior art.

In a next step, the gate electrodes are laterally structured by covering the surface of substrate 300 with a hard mask 324 and laterally structuring the hard mask and the underlying layers down to the gate oxide layer 312. This way, two gate electrodes 314.1 and 314.2 are formed in the first and second substrate regions, respectively, e.g., FIG. 7.

In a next step, the gate electrodes are provided with lateral spacers 326 and 328. Furthermore, Silicon is deposited in the source and drain regions 330 to 336, e.g., FIG. 8.

Figure 9:
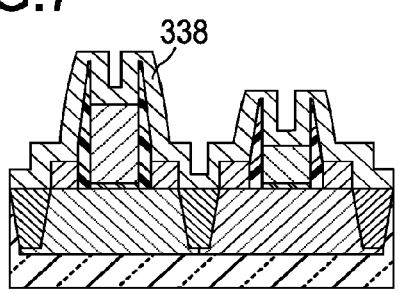
Figure 10:
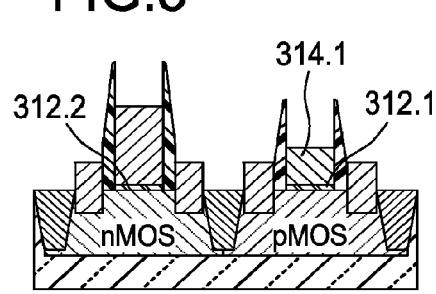

Next, a Nickel layer 338 is deposited after removal of the hard mask 324, e.g., FIG. 9.

In a subsequent first annealing step, which is typically performed at 290° C., Nickel silicide in the form of $Ni_2Si$ is formed in the whole of the gate electrode 314.1. The second gate electrode 314.2 is partially transformed into Ni$_2$Si, with some Si remaining at larger distances from the original Ni layer 338, i.e. towards the gate electrode layer 312.2 (not shown). Subsequently, a second annealing step is performed, typically at a temperature between 350° C. and 450° C. In this step, the Ni$_2$Si in the gate electrode 312.2 reacts with the remaining Si in the bottom of the gate 312.2 to form NiSi. In the gate electrode 314.1, no further transformation occurs because during the first annealing step, the poly-Si of the gate electrode has completely reacted.

Therefore, the final nominating silicide phase, metal-rich or metal-poor, is only defined by the ratio between the deposited Nickel thickness of layer 338 and the initial height of the respective poly-Si gate electrode. Therefore, a single silicidation step can be used to provide both metal-rich and metal-poor silicides on selected devices.

FIG. 11 shows a semiconductor device according to a prior art for a visualization of the "encroachment" effect and FIG. 12 shows a semiconductor device obtained by an embodiment of the method of the invention and having elevated NMOS source and drain regions.

The term "encroachment" is used for a persistent problem present in source and drain regions after a silicidation with Ni.

The problem leads to increase in the junction leakage as NiSi spikes go behind the heavily doped areas. This situation is illustrated in FIG. 11, where NiSi spikes are shown by reference numbers 402 and 404. Note that the problem does not occur in PMOS FET 406.

To avoid the problem, elevated source and drain regions 420 and 422 are formed in an NMOS FET 424 according to an embodiment of the present invention. The processing required for this structure involves a selective deposition step of epitaxial Silicon for forming the elevated source and drain regions 420 and 422. To this end, underlying substrate regions of the NMOS device 424 are doped with an N-dopant such as Phosphorus or Arsenic.

Since corresponding source and drain regions 426 and 428 of the PMOS FET 430 are doped with Boron, followed by a prebake in H$_2$ ambient atmosphere at 800° C., no deposition takes place in the source and drain regions 426 and 428 when forming elevated source and drain regions 420 and 422. After the selective Si deposition, a silicidation is performed. However, since the Silicon surface is removed from the spacer edges and the source and drain implantation fronts, the elevated source and drain regions 420 and 422 make it possible to limit the lateral diffusion of the silicide under the gate. In summary, the method provides an effective way to the processing complexity for a selective deposition of Si or SiGe on a Si or SiGe surface.

In summary, by providing at least one first surface region with a Boron doping of a suitable concentration range and exposing the substrate surface to a cleaning and passivating ambient atmosphere in a prebake step at a temperature lower or equal than 800° C., a subsequent deposition step of Si or SiGe will not lead to a layer deposition in the first surface region. This effect is used for selective deposition of Si or SiGe in the second surface region, which is not doped with Boron in the suitable concentration range, or doped with another dopant, or not doped. The method thus saves a usual photolithography sequence required for selective deposition of Si or SiGe in the second surface region according to the prior art.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

Instead of Si or SiGe, also other semiconductor materials may be used, if or when applicable.

The invention claimed is:

1. A method, comprising:
    masking a surface of a layer on a semiconductor substrate, the layer comprising silicon or silicon-germanium, to define an unmasked area of the layer;
    implanting a Boron dopant into said unmasked area of the layer to produce a surface region of the layer doped with Boron;
    removing the masking to reveal a non-Boron doped surface region of the layer;
    baking the semiconductor substrate to passivate the semiconductor substrate;
    wherein baking comprises baking at a temperature which is below a temperature such that passivation is not achieved in the surface region doped with Boron but passivation is achieved in the non-Boron doped surface region;
    performing a deposition on the surface of the layer in the absence of a mask which results in selective growth of silicon or silicon-germanium over the passivated non-Boron doped surface region to form a first region of the layer having a first thickness and wherein growth is suppressed over the non-passivated surface region doped with Boron to form a second region of the layer having a second thickness less than the first thickness.

2. The method of claim 1, wherein surface region doped with Boron has a Boron dopant concentration of at least $1 \times 10^{19}$ cm$^{-3}$.

3. The method of claim 1, wherein the layer of the semiconductor substrate comprises one or more gate lines.

4. The method of claim 1 further comprising exposing to a cleaning solution after implanting and before baking.

5. The method of claim 4, wherein the cleaning solution is hydrofluoridic acid.

6. The method of claim 1, wherein said temperature for baking comprises a temperature below or equal to 800° Centigrade.

7. The method of claim 1, further comprising:
    masking said unmasked area of the layer which is Boron doped; and
    implanting into the non-Boron doped surface region a dopant other than Boron.

8. The method of claim 7, wherein the dopant other than Boron is Arsenic or Phosphorus.

9. The method of claim 1, wherein baking is performed in a passivating H$_2$ ambient atmosphere.

10. The method of claim 1, wherein the layer is one of a monocrystalline layer or a polycrystalline layer.

11. The method of claim 1, further comprising:
    patterning the first region to define a first transistor gate electrode having said first thickness;
    patterning the second region to define a second transistor electrode having said second thickness.

12. The method of claim 11, further comprising:
depositing a metal layer on the first transistor gate electrode and the second transistor gate electrode;
performing an annealing so to transform of the first transistor gate electrode into a first silicided gate electrode and transform the second transistor gate electrode into a second silicided gate electrode.

13. The method of claim 12, wherein the first silicided gate electrode has a metal-poor silicide phase and the second silicided gate electrode has a metal-rich silicide phase.

14. The method of claim 12, wherein performing the annealing comprises:
performing a first annealing at a first annealing temperature and first annealing time suitable for forming a fully-silicided metal-rich silicide phase for the second silicided gate electrode and forming a partially-silicided first transistor gate electrode; and
performing a second annealing at a second annealing temperature and second annealing time suitable for forming a fully-silicided metal-poor silicide phase for the first transistor gate electrode.

15. The method of claim 11, further comprising providing lateral spacers on either side of the first and second transistor gate electrodes.

16. The method of claim 15, further comprising depositing silicon on the substrate adjacent the lateral spacers to provide a source and a drain for each of the first and second transistor gate electrodes.

17. A method, comprising:
defining on a surface of a layer on a semiconductor substrate a first surface region and a second surface region, the layer comprising silicon or silicon-germanium;
implanting a Boron dopant into the second surface region but not the first surface region;
selectively passivating the semiconductor substrate such that the Boron doped second surface region is not passivated while the non-Boron doped first surface region is passivated;
performing a deposition on the surface of the semiconductor substrate in the absence of a mask which causes selective growth of silicon or silicon-germanium over the passivated non-Boron doped first surface region to form a first region having a first thickness and wherein growth is suppressed over the non-passivated Boron doped second surface region to form a second region having a second thickness less than the first thickness.

18. The method of claim 17, wherein selectively passivating comprises baking the semiconductor substrate in a passivating $H_2$ ambient atmosphere at a temperature below or equal to 800° Centigrade.

19. The method of claim 17, wherein second surface region doped with Boron has a Boron dopant concentration of at least $1\times10^{19}$ cm$^{-3}$.

20. The method of claim 17, further comprising:
patterning the first region to define a first transistor gate electrode having said first thickness;
patterning the second region to define a second transistor gate electrode having said second thickness.

21. The method of claim 20, further comprising:
depositing a metal layer on the first transistor gate electrode and the second transistor gate electrode;
performing an annealing so to transform of the first transistor gate electrode into a first silicided gate electrode and transform the second transistor gate electrode into a second silicided gate electrode.

22. The method of claim 21, wherein the first silicided gate electrode has a metal-poor silicide phase and the second silicided gate electrode has a metal-rich silicide phase.

23. The method of claim 21, wherein performing the annealing comprises:
performing a first annealing at a first annealing temperature and first annealing time suitable for forming a fully-silicided metal-rich silicide phase for the second silicided gate electrode and forming a partially-silicided first transistor gate electrode; and
performing a second annealing at a second annealing temperature and second annealing time suitable for forming a fully-silicided metal-poor silicide phase for the first transistor gate electrode.

24. A method, comprising:
preparing a semiconductor substrate having a layer with a first region and a second region;
implanting Boron at a concentration of at least $1\times10^{19}$ cm$^{-3}$ in only the second region and not the first region;
selectively passivating the semiconductor substrate such that the Boron doped second region is not passivated while the non-Boron doped first region is passivated;
depositing a silicon-based overlayer after implanting and passivating, and without masking, said silicon-based overlayer provided on the non-Boron doped first region and not provided on the Boron doped second region;
siliciding both the first region and the second region to form a first metal silicide phase in the first region and a second metal silicide phase in the second region, wherein the first metal silicide phase has a lower relative metal content than the second metal silicide phase.

25. The method of claim 24, wherein siliciding comprises:
depositing a metal layer having a same thickness over each of the first and second regions;
annealing at a first temperature and first time span to form a fully-silicided phase for the second region and a partially-silicided phase for the first region; and
annealing at a second temperature and a second time span to convert the partially-silicided phase for the first region into a fully-silicided phase for the first region.

26. The method of claim 24, further comprising patterning the first region and the second region to define first and second transistor gate electrodes, respectively, said first and second transistor gate electrodes being fully silicided by said step of siliciding, and said first and second transistor gate electrodes having different silicide phases.

27. The method of claim 26, further comprising depositing a silicon-based material for source and drain structures on either side of each of the first and second transistor gate electrodes.

28. A method, comprising:
preparing a layer on a semiconductor substrate to have a first region and a second region, the layer comprising silicon or silicon-germanium;
implanting a Boron dopant in the second region to a concentration of at least $1\times10^{19}$ cm$^{-3}$, thereby providing on the layer both an implanted surface and an unimplanted surface;
passivating the semiconductor substrate at temperature which provides an unpassivated surface in the second region and a passivated surface in the first region, where said unpassivated surface suppresses further silicon or silicon-germanium deposition on said surface in the second regions while the passivated surface in the first region allows for further silicon or silicon-germanium deposition on the semiconductor substrate; and performing a selective deposition of silicon or silicon-germanium on the semiconductor substrate over the first region but not over the second region.

29. The method of claim 28, wherein passivating comprises performing a hydrogen passivation at an ambient atmosphere and a temperature less than or equal to 800° Centigrade.

30. The method of claim 28, further comprising cleaning the semiconductor substrate with hydrofluoridic acid after implanting.

31. The method of claim 28, further comprising siliciding the silicon or silicon-germanium material of the layer on the semiconductor substrate to form a first silicide phase in the first region and a second silicide phase in the second region.

32. The method of claim 31, wherein the first silicide phase is a metal-poor silicide phase and the second silicide phase is a metal-rich silicide phase.

33. The method of claim 32, wherein the first region is patterned to form a first transistor gate electrode, and the metal-poor silicide phase defines a first fully silicided transistor gate electrode, and wherein the second region is patterned to form a second transistor gate electrode, and the metal-rich silicide phase defines a second fully silicided transistor gate electrode.

34. The method of claim 33, wherein the first fully silicided transistor gate electrode is defined for an nMOS transistor and the second fully silicided transistor gate electrode is defined for a pMOS transistor.

* * * * *